United States Patent
Kaczman et al.

(10) Patent No.: US 8,045,943 B2
(45) Date of Patent: Oct. 25, 2011

(54) HIGH PERFORMANCE CMOS RADIO FREQUENCY RECEIVER

(75) Inventors: Daniel L. Kaczman, Gurnee, IL (US); Mohammed S. Alam, Grayslake, IL (US); David L. Cashen, Wauconda, IL (US); Lu M. Han, Chicago, IL (US); Mohammed Rachedine, Lincolnshire, IL (US); Manish N. Shah, Vernon Hills, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 883 days.

(21) Appl. No.: 12/021,534

(22) Filed: Jan. 29, 2008

(65) Prior Publication Data
US 2009/0191833 A1    Jul. 30, 2009

(51) Int. Cl.
*H04B 1/18* (2006.01)
*H04B 1/26* (2006.01)
(52) U.S. Cl. .................... 455/293; 455/318; 455/326
(58) Field of Classification Search .............. 455/280, 455/283, 293, 318, 323, 326, 334
See application file for complete search history.

(56) References Cited

U.S. PATENT DOCUMENTS

| | | | |
|---|---|---|---|
| 6,963,734 B2 * | 11/2005 | Sorrells et al. | 455/296 |
| 7,177,616 B2 | 2/2007 | Connell et al. | |
| 2006/0046681 A1 * | 3/2006 | Bagheri et al. | 455/333 |
| 2006/0057983 A1 * | 3/2006 | Thompson et al. | 455/127.3 |
| 2007/0132500 A1 | 6/2007 | Embabi et al. | |
| 2007/0218857 A1 * | 9/2007 | Ismail et al. | 455/323 |
| 2008/0303598 A1 * | 12/2008 | Rao et al. | 330/296 |

OTHER PUBLICATIONS

Sacchi et al., "A 15 mW, 70 kHz $1/f$ Corner Direct Conversation CMOS Receiver", IEEE 2003 Custom Integrated Circuits Conference, 2003, pp. 459-462.

* cited by examiner

*Primary Examiner* — Nguyen Vo
(74) *Attorney, Agent, or Firm* — Lempia Summerfield Katz LLC

(57) ABSTRACT

A high performance radio frequency receiver includes a low noise amplifier with large binary and stepped gain control range, controlled impedance, and enhanced blocker immunity, for amplifying and converting a radio frequency signal to a current; a pulse generator for generating in-phase and quadrature pulses; a crossover correction circuit and pulse shaper for controlling a crossover threshold of the pulses and interaction between in-phase and quadrature mixers; and a double balanced mixer for combining the RF signal with the pulses to generate an intermediate frequency or baseband zero intermediate frequency current-mode signal. The in-phase and quadrature pulses have a duty cycle of 20-35%. The intermediate frequency signal and second order harmonics may be filtered with a high frequency low pass filter and a current injected complex direct-coupled filter. Decreased die size, current drain, cost, and complexity, as well as improvements in gain, 1/f noise, noise figure, sensitivity, and linearity may result.

19 Claims, 10 Drawing Sheets

US 8,045,943 B2

HIGH PERFORMANCE CMOS RADIO FREQUENCY RECEIVER

BACKGROUND

1. Field

The present embodiments relate generally to communications, and more specifically, to radio frequency receivers in communications.

2. Related Art

Radio frequency (RF) receivers used in modern communication systems may support multiple modes and networks, such as 3G wideband code division multiple access (WCDMA) and 2G Global System for Mobile communications (GSM) using time division multiple access (TDMA). A received RF signal in a certain mode may be translated into a specified frequency band and processed to retrieve the information contained in the RF signal. For example, an RF receiver may amplify, filter, and mix an analog received RF signal into in-phase (I) and quadrature (Q) signals that may be converted into digital signals for further processing.

The multiple modes may utilize the same RF receiver architecture but have different frequency ranges and linearity, noise figure, and sensitivity requirements. Noise figure is a measure of degradation of a signal to noise ratio caused by components in the RF receiver. In particular, a WCDMA system has full duplex functionality where separate receive and transmit signals may be active simultaneously. A higher power transmitted signal may leak into the receive signal in such a system. To relax linearity and noise requirements due to the transmit signal leakage, a conventional WCDMA system may include a surface acoustic wave (SAW) filter prior to a mixer and downstream processing stages. In addition, a conventional WCDMA system may include a low noise amplifier (LNA) to meet sensitivity, noise figure, and gain control requirements. Using a SAW filter, LNA, amplifiers, and other components may result in increased die size, current drain, cost, and complexity, and reduced performance of an RF receiver.

A mixer may combine the received RF signal with the I and Q pulses. The I and Q pulses may be generated by a pulse generator based on a periodic signal from a local oscillator. The pulse generator in a conventional RF receiver may generate pulses with a 150% duty cycle, including I pulses 0 and 180 degrees out of phase from the periodic signal, and Q pulses 90 and 270 degrees out of phase from the periodic signal. The I and Q pulses may control switches in the mixer to combine the received RF signal with the I and Q pulses. The switches may not be on at the same time if the rise and fall times of the I and Q pulses are ideal. However, if the 50% duty cycle I and Q pulses have non-ideal rise and fall times, the switches in the mixer may be partially on when an amplitude of the I and/or Q pulse is above a crossover threshold, resulting in degraded performance and increased current drain.

Large transmit signal leakages may also affect the gate voltage bias of a mixer, leading to degraded noise figure, 1/f noise, gain, and second order input intercept point (IIP2). Moreover, a conventional RF receiver including operational amplifiers and voltage mode mixers may have poor IIP2 and third order input intercept point (IIP3). A conventional RF receiver may also include transimpedance amplifiers that may have a pole in the modulation bandwidth. Such transimpedance amplifiers may increase current drain, integrated noise, and die area.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

By way of introduction, the preferred embodiments described below include a radio frequency (RF) receiver including a low noise amplifier, a pulse generator, a crossover correction circuit, a passive doubled balanced mixer, and a direct coupled complex filter. The low noise amplifier may convert a received voltage of an RF signal to a current and amplify the current by a specified transconductance. The current may be injected into a passive double balanced mixer, which may combine the current with in-phase (I) and quadrature (Q) pulses to generate an intermediate frequency signal, which may be a low, very low, or zero intermediate frequency signal. The I and Q pulses may have duty cycles of less than 35% and be generated by a pulse generator. A crossover correction circuit may control an amplitude crossover threshold of the I and Q pulses to reduce the amount of time switches in the mixer are simultaneously active when the I and Q pulses are rising and falling. The intermediate frequency signal generated by the mixer may include I and Q signals that are current injected into a direct coupled complex filter. The direct coupled complex filter may filter the intermediate frequency signal to a filtered analog signal for further processing. These embodiments of a RF receiver may result in a decrease in die size, current drain, cost, or complexity. In addition, there may be an improvement in gain, 1/f noise, noise figure, sensitivity, or linearity.

Figure 1:
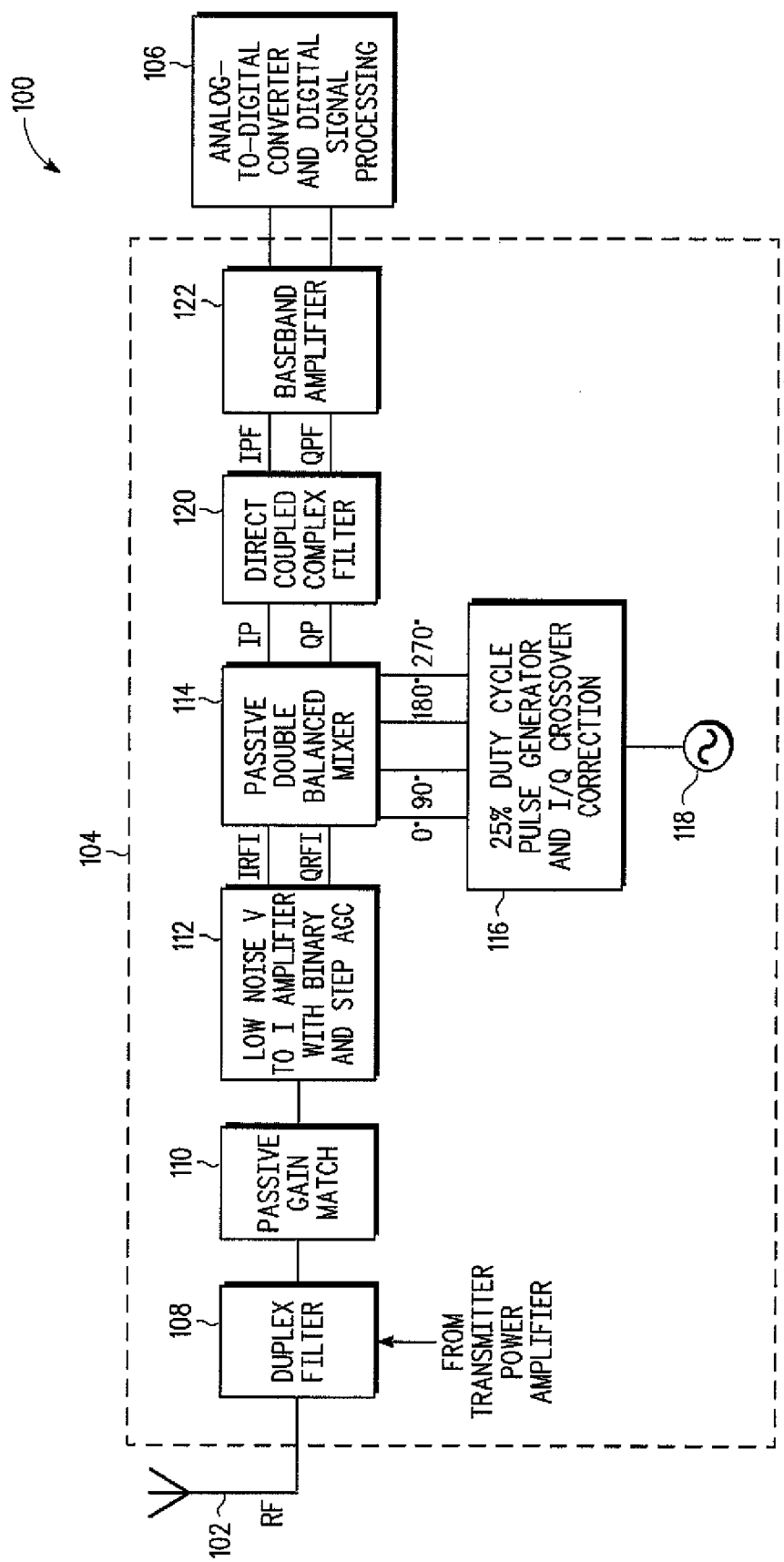
FIG. 1 is a diagram of an embodiment of a radio frequency receiver.

FIG. 1 shows an embodiment of a radio frequency receiver 100. All or a portion of the RF receiver 100 may be fabricated as an integrated circuit. The RF receiver 100 may also include discrete components. The RF receiver 100 receives an RF signal on an antenna 102 for processing in an analog front end 104 to a filtered analog signal in a certain frequency band. The filtered analog signal may be provided to an optional baseband gain amplifier 122 to provide additional gain, filtering, and automatic gain control (AGC) range. In addition, the receiver 100 may include DC offset and IIP2 calibration or enhancements, such as notch filtering. The DC offset correction may be included after a direct coupled filter 120 and prior to the baseband gain amplifier 122. An analog-to-digital converter and digital signal processor 106 may then recover the information contained in the received RF signal.

In the analog front end 104, the received RF signal may be filtered by a duplex filter 108. The duplex filter 108 may include a receive filter for filtering received RF signals and a transmit filter for filtering transmit RF signals from a power amplifier in a transmitter. Noise and interference in the RF signals may be attenuated by the duplex filter 108. For example, for 3GPP Band I, the duplex filter 108 allows signals from approximately 2110 MHz to 2170 MHz to pass from the antenna 102 to the receiver, and allows signals from approximately 1920 MHz to 1980 MHz to pass from the transmitter to the antenna 102. The receive filter may be substantially isolated from the transmit filter in the duplex filter 108. However, in a full duplex WCDMA system, for example, both the received and transmitted signals may be active simultaneously. A higher power transmitted signal may leak into the received signal in the duplex filter 108, leading to a degradation of the noise figure, gain, and performance of the RF receiver 100.

The filtered RF signal from the duplex filter 108 may be input to a passive gain matching circuit 110. The passive gain matching circuit 110 steps up the impedance of the filtered RF signal such that the voltage of the filtered RF signal is multiplied by a gain while adding minimal noise. The matching circuit 110 may also include a high-pass filter to provide extra rejection and attenuation of leaked transmit RF signals that are at a lower frequency than received RF signals. The filtered and matched RF signal may be input into a low noise voltage to current amplifier 112 configured as a transconductance amplifier. The RF signal may be converted from a voltage to a current. The gain of the low noise amplifier 112 may be determined by the transconductance of the low noise amplifier 112 and the feedback resistance of the direct coupled filter 120. For example, for WCDMA SAW-less operation, the gain of the amplifier 112, passive mixer 114, and direct coupled filter 120 may be set to approximately 45 dB+/−2 dB. In this case, a gain control range of approximately 40 dB+/−1 dB with controlled input impedance would be needed in the amplifier 112. The RF signal may be input to the low noise amplifier 112 as differential signals to reduce the effects of interference and noise.

The low noise amplifier 112 may include step and binary weighted gain control to increase the dynamic range of the receiver, and to provide larger gain to weaker signals and smaller gain to stronger signals. The step gain control in the low noise amplifier 112 may adjust the gain in discrete intervals. The binary weighted gain control may further adjust the gain in binary intervals with digital control bits provided by a controller. The digital control bits may be any desired bit width to adjust the gain in binary intervals. Binary weighted gain control may be achieved by switching current away from the load. Binary weighted gain control may be implemented with any number of control bits where attenuation for each step is determined by the equation $20*\log(1-2^{\wedge}(n-2)/(2^{\wedge}n-1))$, where n is the number of control bits. However, as the number of control bits exceeds approximately five bits, the circuit complexity and die area may increase, and gain control range may diminish due to layout and device parasitics. For example, a five bit binary weighted gain control without a coarse step can achieve thirty steps for a total gain control range of approximately 29.8 dB versus a desired range. A 10.7 dB coarse step may be added to achieve a 40.3 dB total RF automatic gain control (AGC) range required for WCDMA SAW-less operation within a single stage. The coarse step gain control may add additional gain control range by reducing load resistance through adding a smaller shunt load. This may be realized with a pair of NMOS or PMOS transistors that are connected across a common mode feedback resistor. The transistors lower the output impedance while keeping the input impedance substantially constant.

Although the step and binary weighted gain control may increase the total gain control range, the input impedance of the low noise amplifier 112 remains substantially constant because the current drain in the transconductance stage is kept substantially constant. The gain of the amplifier 112 may be controlled by an AGC state machine, for example. The active PMOS load devices 218 and 220, the common-mode feedback circuit 234, and resistors R3 and R4 in FIG. 2 may be replaced with load resistors or a reactive/tuned load using the same gain control concept. This configuration may also be modified to include multiple bands.

The low noise amplifier 112 may also minimize desensitization of the receiver 100 that are due to large blocking signals. A large continuous wave or modulated blocking signal at the input of the receiver 100 may cause nonlinear effects and receiver desensitization due to a rise in the noise figure. Non-linear mixing of bias circuit noise with a large blocking signal, for example, may contribute to a rise in the noise figure. An active bias generator 201 (shown in FIG. 2) may bias the low noise amplifier 112 to prevent bias noise from mixing into the receiver 100. The drain and gate of an NMOS current mirror 208 in the active bias generator 201 is connected to the gate and source of an NMOS transistor 210, respectively, which operates in the deep triode region. The drain of the NMOS transistor 210 is connected to the supply voltage Vcc. With this bias from the active bias generator 201, noise figure desensitization may be improved at all blocker offsets. A small trickle bias current source may also be connected from the gate of the NMOS current mirror 208 and the source of the NMOS transistor 210 to ground to aid start up.

The current generated by the low noise amplifier 112 may drive a passive double balanced mixer 114. The current may be split into a current going to an I mixer, IRFI, and a current going to a Q mixer, QRFI. The currents may be input to the mixer 114 as differential signals. The mixer 114 may combine the currents with I and Q pulses to produce a set of currents IP and QP comprising an intermediate frequency signal, which may be a zero intermediate frequency baseband signal. A zero intermediate frequency baseband signal may be produced when the receiver 100 is in a direct conversion mode, e.g., when the frequency of the received RF signal and the frequency of a periodic signal from a local oscillator 118 are approximately equal. The currents IP and OP may be generated as differential signals to reduce the effects of interference and noise. A pulse generator 116 may generate the I and Q pulses based on the periodic signal from the local oscillator 118. The I and Q pulses may have a duty cycle of less than 35%. Other duty cycles above 35% are possible, however, the performance of the amplifier 112 and direct coupled filter 120 may be degraded when the duty cycle is more than 35%. The duty cycle of the I and Q pulses may range from 20-35%. The I pulses may include a first pulse zero degrees out of phase from the periodic signal, and a second pulse 180 degrees out of phase from the periodic-signal. The Q pulses may include a third pulse 90 degrees out of phase from the periodic signal, and a fourth pulse 270 degrees out of phase from the periodic signal. The pulse generator 116 may generate the I and Q pulses using latches, combinatorial logic, sequential logic, or other logic.

The pulse generator 116 may also include a crossover correction circuit to control an amplitude crossover threshold of the I and Q pulses. The crossover correction circuit may adjust the amplitude crossover threshold to reduce the amount of time the I and Q pulses are simultaneously active. The amplitude crossover threshold may include a crossing point of the I and Q pulses when one pulse is rising and the other is falling, for example. In other words, because the I and Q pulses may control switches in the mixer 114, it is desirable to adjust the amplitude crossover threshold of the I and Q pulses so that the switches are not turned on at the same time. Performance of the RF receiver 100 may be improved and current drain may be reduced when the amplitude crossover threshold is adjusted in this fashion. Using the mixer 114 to combine I and Q currents with less than 35% duty cycle crossover corrected I and Q pulses may result in an improvement in gain, noise figure, linearity, and IIP2, as well as a reduction in 1/f noise and noise figure degradation when a large blocker signal is present.

Crossover correction in the pulse generator 116 may be beneficial in a WCDMA full duplex SAW-less receiver where the noise figure of the receiver 100 should be very low in the presence of a large transmitter signal. For example, gain, noise figure, IIP3, IIP2 and 1/f noise may be improved by approximately 3 dB, 2.5 dB, 3 dB, 15 dB and 15 dB, respectively. Adjusting the gate threshold and sharpening the fall time of the pulse may result in additional pulse shaping. The crossover between the I and Q pulses can be further reduced by decreasing the channel width to length (W/L) ratio of the PMOS device relative to the NMOS inverter device of a complementary inverter. For example, a complementary rail to rail inverter may be optimized with a PMOS device W/L ratio of 2.5 and an NMOS device W/L ratio of 1. Alternatively, by making the W/L ratio of the PMOS device equal to 1 and the W/L ratio of the NMOS device equal to 1, the falling edge may be made sharper than the rising edge, and the crossover is reduced. If a rail to rail output AND or NOR gate is used instead of an inverter, the complementary output devices can be sized to have similar effect.

The currents IP and QP comprising the intermediate frequency signal produced by the mixer 114 may be filtered by a direct coupled complex filter 120. The filter 120 may perform second ordering filtering of the intermediate frequency signal. The filter 120 may include voltage mode operational amplifiers with current inputs. Current mode operational amplifiers may also be used in the filter 120 to filter the intermediate frequency signal. The filter 120 may produce filtered analog signals IPF and QPF that may be converted to digital signals and digital signal processed downstream in the RF receiver 100 to retrieve the information contained in the received RF signal. The filtered analog signals IPF and QPF may be generated as differential signals.

Configuring the filter 120 in this fashion may allow elimination of the pole within the modulation bandwidth used in conventional RF receivers. Using a direct coupled complex filter 120 may result in a relaxed linearity requirement in downstream processing stages, and reduction in noise, die size, and current drain. For example, for 3GPP Bands II, III, and V, where a 3G system co-exists with a 2G GSM system, a 3G receiver is required to meet narrow band blocker at 2.7 MHz and 3.5 MHz. A conventional receiver may achieve this requirement by putting a pole in a modulation bandwidth. This is not desirable for a SAW-less receiver as it may significantly degrade the noise figure of the receiver. Also, in a conventional receiver, the pole in the modulation bandwidth is typically realized as RC feedback in a transimpedance amplifier. This transimpedance stage, with a non-complex pole, adds current drain and die area. The lower frequency of the mixer pole also contributes to additional die area. The transfer function of the complex filter following this transimpedance stage in a conventional receiver typically has to correct for the in-band pole, resulting in higher in-band ripple and higher group delay ripple. In-band pole and noise figure degradation may be eliminated by using the direct coupled filter 120 with second order complex filtering. For example, the noise figure of a WCDMA receiver may be improved by approximately 0.3 dB by using the direct coupled filter 120 and eliminating the in-band pole and biquad noise peaking. Group delay in-band ripple for a WCDMA/GSM compressed-mode receiver may be reduced from approximately 139 ns to 65 ns.

Figure 2:
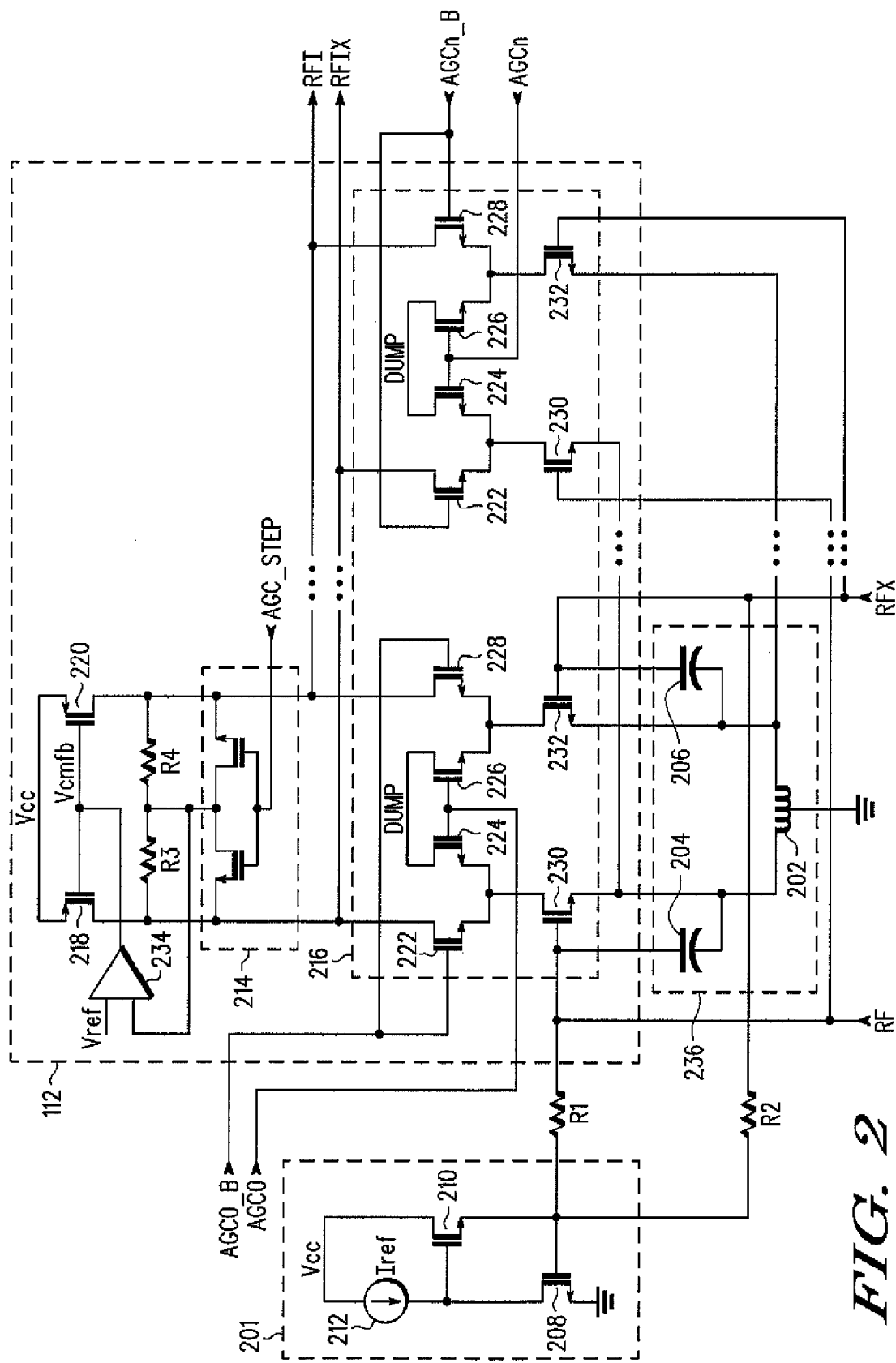
FIG. 2 is a circuit diagram of a low noise voltage to current amplifier in the embodiment of the radio frequency receiver of FIG. 1.

FIG. 2 is a circuit diagram of the low noise amplifier 112 in one embodiment of the radio frequency receiver 100. In FIG. 2, a voltage of the received RF signal may be converted to a current. The generated current may be a function of the voltage of the received RF signal. The received RF signal may be input to the low noise amplifier 112 as differential signals RF and RFX, as shown in FIG. 2. The received RF signal may have been filtered by the duplex filter 108 and passive gain match circuit 110 prior to input to the low noise amplifier 112.

If the received RF signal is single-ended, a source degeneration circuit 236 may convert the single-ended received RF signal to a differential RF signal for use within the low noise amplifier 112. An inductor 202 center tapped to ground and capacitors 204 and 206 may be included in the source degeneration circuit 236 to optimize noise, input impedance, and linearity. The received RF signal is then amplified by a gain and converted from a voltage to a current in the low noise amplifier 112. The active bias generator 201, which minimizes the up-conversion of low frequency noise with the presence of strong blockers, may include NMOS transistors 208 and 210, a reference current source 212, and resistors R1 and R2. The NMOS transistor 210 may operate in the deep sub-threshold region.

The matched RF signal may be provided to the low noise amplifier 112, which may be configured as a transconductance amplifier. The matched RF signal voltage may be converted into a current and amplified by a gain in the low noise amplifier 112. The low noise amplifier 112 may generate differential currents RFI and RFIX. The currents RFI and RFIX may be split to go to an I mixer and Q mixer in the passive double balanced mixer 114. The low noise amplifier 112 may include a step gain control section 214 controlled by a signal AGC_STEP, and a binary weighted gain control section 216 controlled by signals AGCx and AGCx_B, where x is the bit width of the signals AGCx and AGCx_B. The signals AGC_STEP, AGCx, and AGCx_B may be provided by a controller (not shown) to vary the gain as desired. In particular, the step gain control may adjust the gain in discrete intervals with the AGC_STEP signal. The NMOS transistors in the step gain control 214 may be positioned in parallel to common mode feedback resistors R3 and R4 and PMOS transistors 218 and 220. This may result in a reduction of the output impedance of the low noise amplifier 112, which provides a step gain, while the input impedance is unaffected. In addition, a differential amplifier 234 may compare a reference voltage Vref with a divided voltage to adjust the common mode feedback voltage Vcmfb. The common mode feedback voltage Vcmfb may drive the gates of the PMOS transistors 218 and 220. When the transistors in the step gain control section 214 are on, the load is shunted, reducing the load impedance and decreasing the gain. The input impedance remains substantially constant because the transconductance of the stage remains substantially constant.

The binary weighted gain control 216 may further adjust the gain in binary intervals with the AGCx and AGCx_B signals. In particular, the possible binary intervals may depend on the bit width of the AGCx and AGCx_B signals. Each bit of the AGCx and AGCx_B signals may correspond to a stage in the binary weighted gain control 216. In FIG. 2, each stage may include NMOS transistors 222, 224, 226, 228, 230, and 232 arranged such that the AGCx and AGCx_B signals may weight the gain of the RF and RFX signals. Binary weighted gain control may be achieved by switching current away from the load and into the DUMP node. Binary weighted gain control may be implemented with any number of control bits where attenuation for each step is determined by the equation $20*\log(1-2^{(n-2)}/(2^n-1))$, where n is the number of control bits. However, as the number of control bits exceeds approximately five, the circuit complexity increases and gain control range diminishes. For example, a five bit binary weighted gain control without a coarse step can achieve thirty steps for a total gain control range of approximately 29.8 dB versus a desired range. Gain of the amplifier may be controlled by an AGC (Automatic Gain Control) state machine. The differential RF signals RF and RFX may drive the gates of the transistors 230 and 232.

Figure 3:
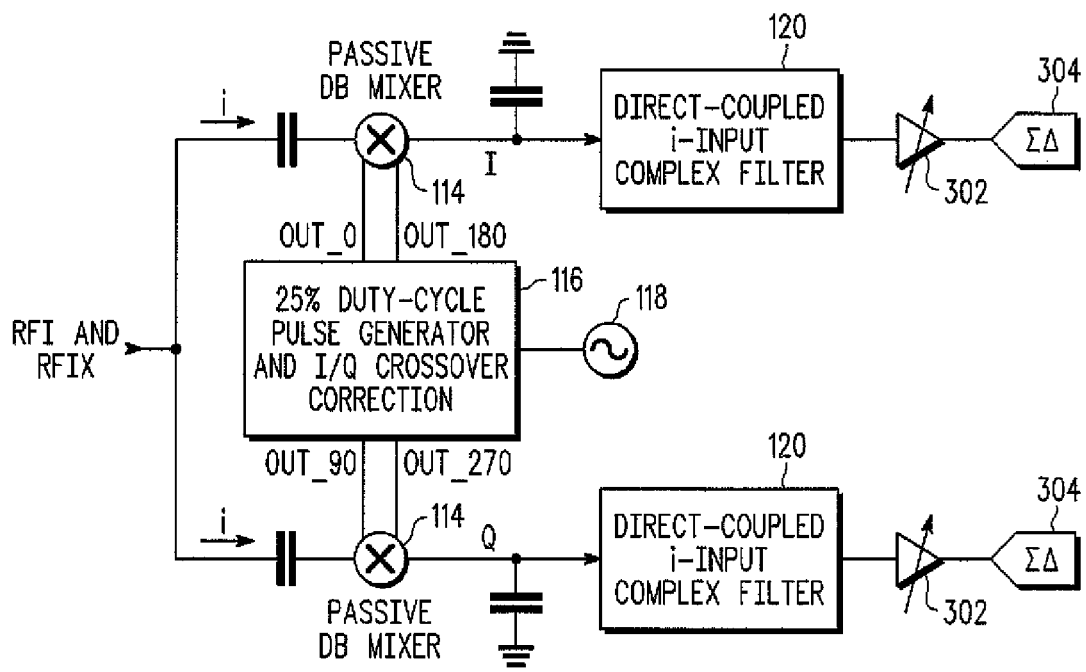
FIG. 3 is a diagram of a passive double balanced mixer, a pulse generator and I/Q crossover correction circuit, a direct coupled complex filter, and an analog-to-digital converter in the embodiment of the radio frequency receiver of FIG. 1.

FIG. 3 is a diagram of passive double balanced mixers 114, a pulse generator and I/Q crossover correction 116, direct coupled complex filters 120, and analog-to-digital converters 304 in the embodiment of the radio frequency receiver 100. In FIG. 3, the differential currents RFI and RFIX received from the low noise amplifier 112 may be mixed with I and Q pulses, then amplified and filtered for conversion in the analog-to-digital converter 112 and downstream processing to retrieve the information contained in the received RF signal. In particular, the differential currents RFI and RFIX may be provided to the passive double balanced mixers 114. The passive double balanced mixer 114 combines the currents RFI and RFIX with the I pulses and the Q pulses separately. The passive double balanced mixers 114 may produce an intermediate frequency signal, which may be a zero intermediate frequency baseband signal. The pulse generator 116 generates the I and Q pulses based on a periodic signal supplied by the local oscillator 118. The periodic signal may be a frequency multiple of the received RF signal or may be another frequency. Capacitors may be used to attenuate any noise and decouple the mixer 114 and downstream components from the low noise amplifier 112. For example, for 3GPP Band I, the periodic signal from the local oscillator 118 may be approximately 4220 MHz to 4340 MHz and the pulses may be approximately 2110 MHz to 2170 MHz.

The pulse generator 116 may generate the I and Q pulses using latches, combinatorial logic, sequential logic, or other logic. For the I current, the pulse generator 116 may produce less than 35% duty cycle I pulses including a first pulse zero degrees out of phase from the periodic signal, and a second pulse 180 degrees out of phase from the periodic signal. For the Q current, the pulse generator 116 may produce less than 35% duty cycle Q pulses including a third pulse 90 degrees out of phase from the periodic signal, and a fourth pulse 270 degrees out of phase from the periodic signal. The pulse generator 116 may also include an I/Q crossover correction circuit that adjusts an amplitude crossover threshold of the I and Q pulses. The amplitude crossover threshold includes the crossing point of the I and Q pulses when one pulse is rising and the other is falling. In particular, because the I and Q pulses may control switches in the mixers 114, it is desirable to adjust the amplitude crossover threshold of the I and Q pulses so that the switches are not turned on at the same time. The crossover correction circuit may operate in parallel with the pulse generator 116, and adjust the I and Q pulses provided to the mixers 114.

The passive double balanced mixers 114 may include transistors, active elements, passive elements, or other components to combine the differential currents RFI and RFIX from the low noise amplifier 112 with the I and Q pulses from the pulse generator 116. Currents comprising the intermediate frequency signal generated by the mixers 114 may be of a desired frequency lower than the received RF signals for downstream processing purposes. The direct coupled complex filters 120 may receive and filter the current-injected intermediate frequency signals. The filters 120 may perform second ordering filtering of the intermediate frequency signal. The filter 120 may include voltage mode operational amplifiers with current inputs. Current mode amplifiers, including current conveyors and other types of operational amplifiers, may also be used in the filter 120. The order of the filter and structure of the filter is not limited to second order and may be tailored to a particular application. The filtered signal generated by the filters 120 may be amplified by low noise amplifiers 302 prior to conversion to a digital signal in the analog to digital converter 304. Alternately, the filtered signal may be provided to the analog to digital converter 304 without amplification. The resulting digital signal may be processed downstream using digital signal processing to retrieve the information contained within the received RF signal.

Figure 4:
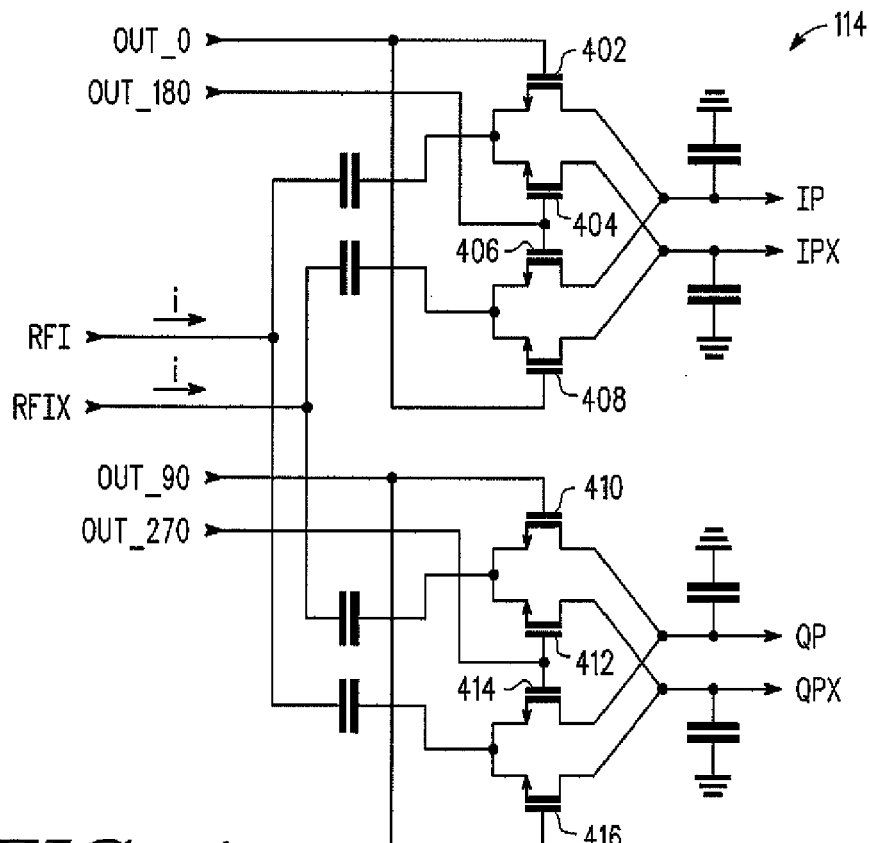
FIG. 4 is a circuit diagram of an embodiment of a passive double balanced mixer.

FIG. 4 is a circuit diagram of an embodiment of a passive double balanced mixer 114. The mixer 114 shown in FIG. 4 receives the currents RFI and RFIX from the low noise amplifier 112. The currents RFI and RFIX are mixed with I pulses OUT_0 and OUT_180 from the pulse generator 116 to produce differential I signals IP and IPX. Similarly, the currents RFI and RFIX are mixed with Q pulses OUT_90 and OUT_270 from the pulse generator 116 to produce differential Q signals QP and QPX. The I and Q pulses from the pulse generator 116 may have a duty cycle of between 20% and 35%. The mixer 114 may include NMOS transistors 402, 404, 406, 408, 410, 412, 414, and 416 to combine the I and Q currents with the I and Q pulses. In particular, the sources of the transistors 402-416 may be coupled to the currents RFI and RFIX. The OUT_0 pulse may drive gates of the transistors 402 and 408 and the OUT_180 pulse may drive gates of the transistors 404 and 406. Similarly, the OUT_90 pulse may drive gates of the transistors 410 and 416, while the OUT_270 pulse may drive gates of the transistors 412 and 414. Capacitors may be included in the mixer 114 to attenuate noise and decouple AC variations in the signals. Other combinations of passive and/or active elements may be included in the mixer 114.

The function of the crossover correction circuit in the pulse generator 116 is clarified with reference to FIG. 4. The crossover correction circuit may adjust the amplitude crossover threshold to reduce the amount of time when the I and Q pulses are simultaneously active. The amplitude crossover threshold may include a crossing point of the I and Q pulses when one pulse is rising and the other is falling, for example. For example, if the OUT_0 pulse and the OUT_90 pulse are both above a certain amplitude crossover threshold, the transistors 402, 408, 410, and 416 may be partially on. Preferably, the I mixer (transistors 402, 404, 406, and 408) and the Q mixer (transistors 410, 412, 414, and 416) are not turned on at the same time, so that current drain is reduced and receiver performance is not affected. The amplitude crossover threshold may be adjusted by the crossover correction circuit such that the I mixer and the Q mixer are not turned on at the same time. The crossover correction circuit is described in more detail below.

Figure 5:
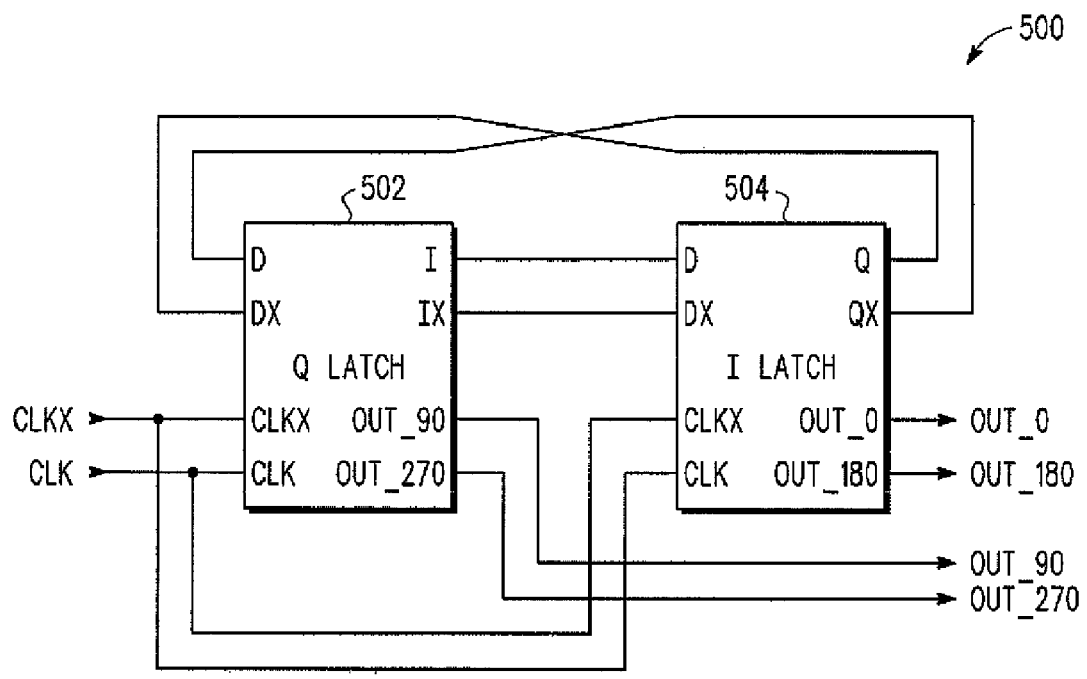
FIG. 5 is a diagram of an embodiment of a pulse generator.
Figure 6:
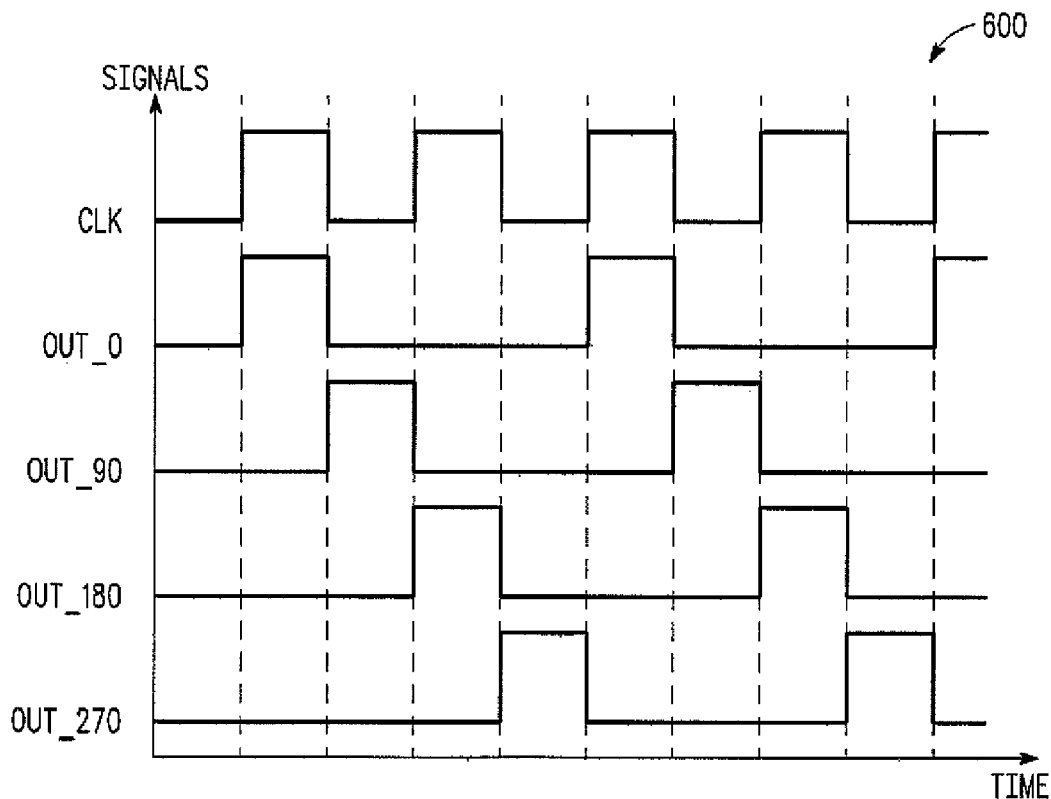
FIG. 6 is a plot of exemplary in-phase and quadrature pulses generated by a pulse generator.

FIG. 5 is a diagram of an embodiment 500 of a pulse generator 116. The pulse generator 500 may provide the I pulses OUT_0 and OUT_180 and the Q pulses OUT_90 and OUT_270 to the mixer 114. The I and Q pulses may have a duty cycle of less than 35%. The pulse generator 116 in FIG. 5 includes a Q latch 502 and an I latch 504 arranged in a feedback configuration. The latches 502 and 504 receive periodic signals CLK and CLKX from the local oscillator 118. The periodic signal CLK may be inverted to provide the periodic signal CLKX. The Q latch 502 may generate the Q pulses at 90 degrees (OUT_90) and 270 degrees (OUT_270) out of phase from the periodic signal. The I latch 504 may generate the I pulses at 0 degrees (OUT_0) and 180 degrees (OUT_180) out of phase from the periodic signal. The data inputs D and DX of the Q latch 502 may be coupled to the QX and Q outputs from the I latch 504, respectively. The data inputs D and DX of the I latch 504 may be coupled to the I and IX outputs from the Q latch 502, respectively. The output QX may be an inversion of the output Q, and the output IX may be an inversion of the output I. FIG. 6 is a plot 600 of exemplary in-phase (I) and quadrature (Q) pulses that may be generated by a pulse generator 116. In FIG. 6, the pulses OUT_0, OUT_90, OUT_180, and OUT_270 that comprise the I and Q pulses are shown as 0, 90, 180, and 270 degrees, respectively, out of phase from the periodic signal CLK. In addition, the I and Q pulses shown in FIG. 6 have an approximately 25% duty cycle.

Figure 7:
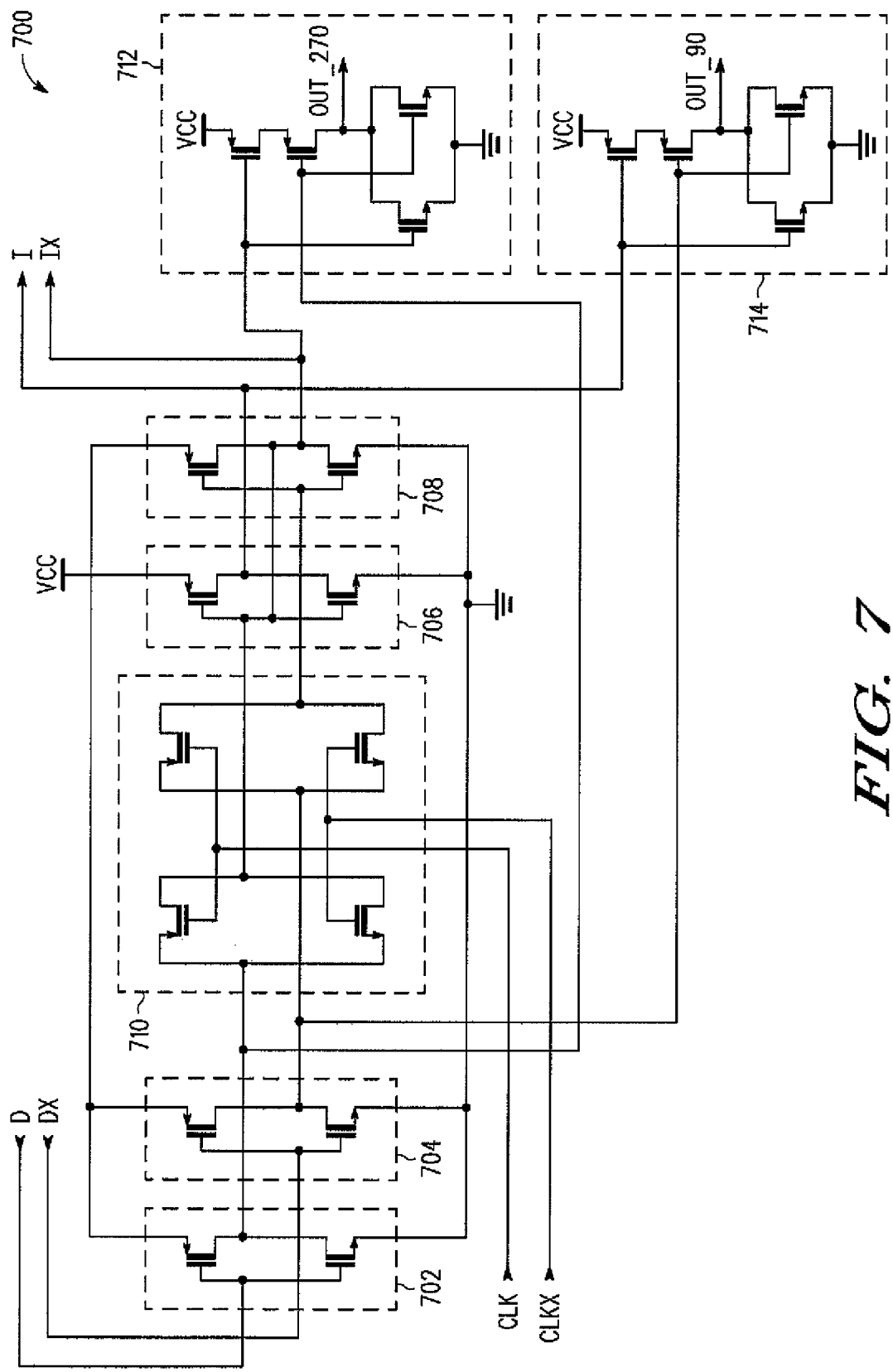
FIG. 7 is a circuit diagram of an embodiment of a latch in the pulse generator of FIG. 5.

FIG. 7 is a circuit diagram of a latch 700 in the pulse generator 116. The latch 700 may generate Q pulses OUT_90 and OUT_270 or I pulses OUT_0 and OUT_180, depending on the signals coupled to the D and DX inputs, when included in the circuit shown in FIG. 5. In FIG. 7, the latch 700 is configured to generate Q pulses OUT_90 and OUT_270, and may be an embodiment of the Q latch 502 of FIG. 5. The D and DX inputs of the latch 700 may alternately be coupled to the QX and Q outputs of an I latch, respectively, such as the I latch 504. The latch 700 includes CMOS transistors arranged as inverters 702, 704, 706, and 708, as a storage element 710, and as NOR gates 712 and 714 for generating the Q pulses. Based on the clock signals CLK and CLKX and the D and DX inputs, the Q pulses OUT_90 and OUT_270 may be generated. The inputs to the NOR gates 712 and 714 may be connected after the inverters 702 and 704, as shown in FIG. 7, or may be connected prior to the inverters 702 and 704. The latch 700 may alternately be configured to generate I pulses OUT_0 and OUT_180, and may be an embodiment of the I latch 504. In this configuration, the D and DX inputs of the latch 700 may be coupled to the I and IX outputs of a Q latch, respectively, such as the Q latch 502.

Figure 8:
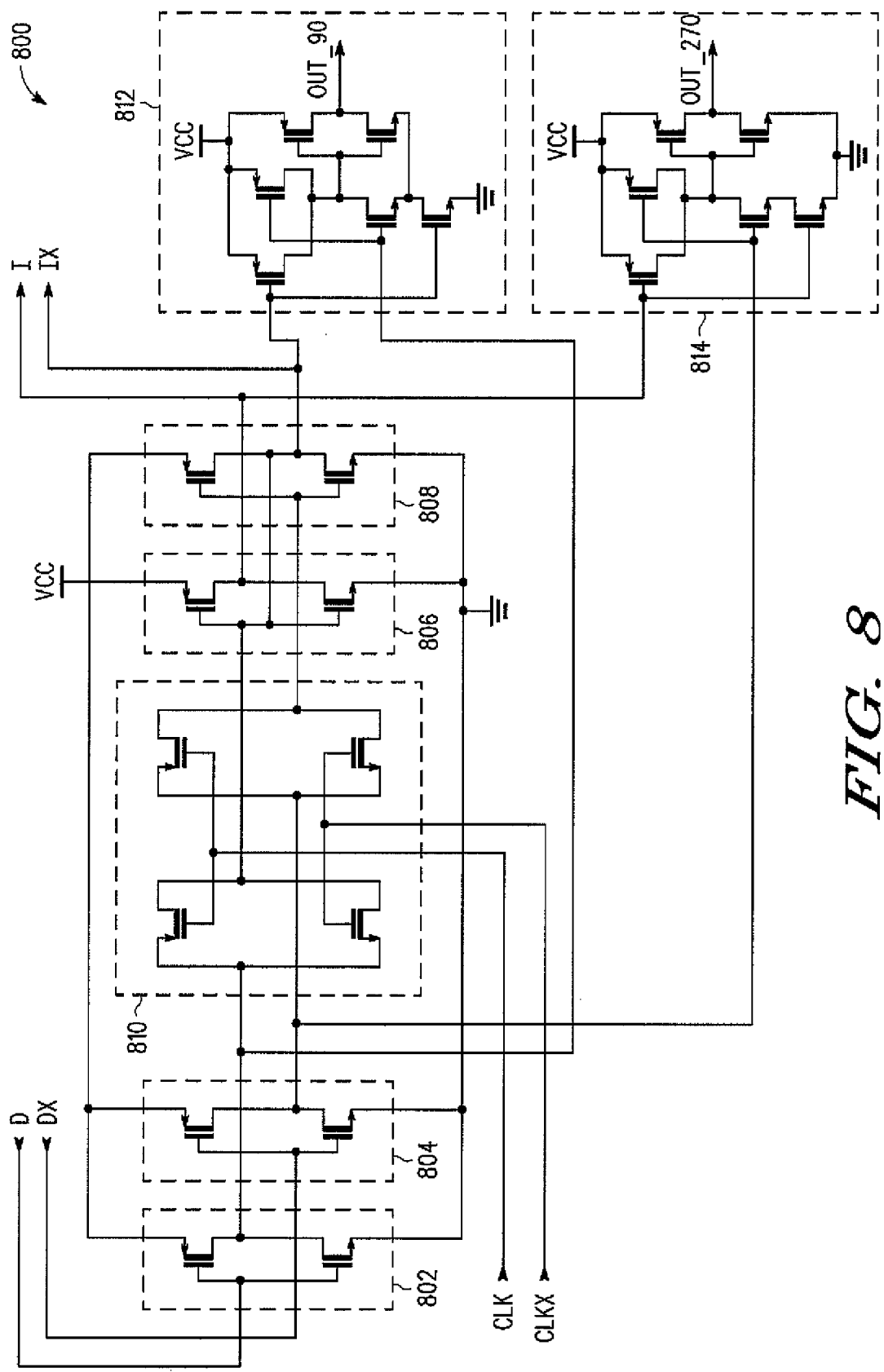
FIG. 8 is a circuit diagram of an alternative embodiment of a latch in the pulse generator of FIG. 5.

FIG. 8 is a circuit diagram of a latch 800 in the pulse generator 116. The latch 800 may generate Q pulses OUT_90 and OUT_270 or I pulses OUT_0 and OUT_180, depending on the signals coupled to the D and DX inputs. In FIG. 8, the latch 800 is configured to generate Q pulses OUT_90 and OUT_270, and may be an alternative embodiment of the Q latch 502 of FIG. 5. The D and DX inputs of the latch 800 may alternately be coupled to the QX and Q outputs of an I latch, respectively, such as the I latch 504. The latch 800 includes CMOS transistors arranged as inverters 802, 804, 806, and 808, as a storage element 810, and as AND gates 812 and 814 for generating the Q pulses. Based on the clock signals CLK and CLKX and the D and DX inputs, the Q pulses OUT_90 and OUT_270 may be generated. The inputs to the AND gates 812 and 814 may be connected after the inverters 802 and 804, as shown in FIG. 8, or may be connected prior to the inverters 802 and 804. The latch 800 may alternately be configured to generate I pulses OUT_0 and OUT_180, and may be an embodiment of the latch 504. In this configuration, the D and DX inputs of the latch 800 may be coupled to the I and IX outputs of a Q latch, respectively, such as the Q latch 502. Other latch circuits may be used.

Figure 9:
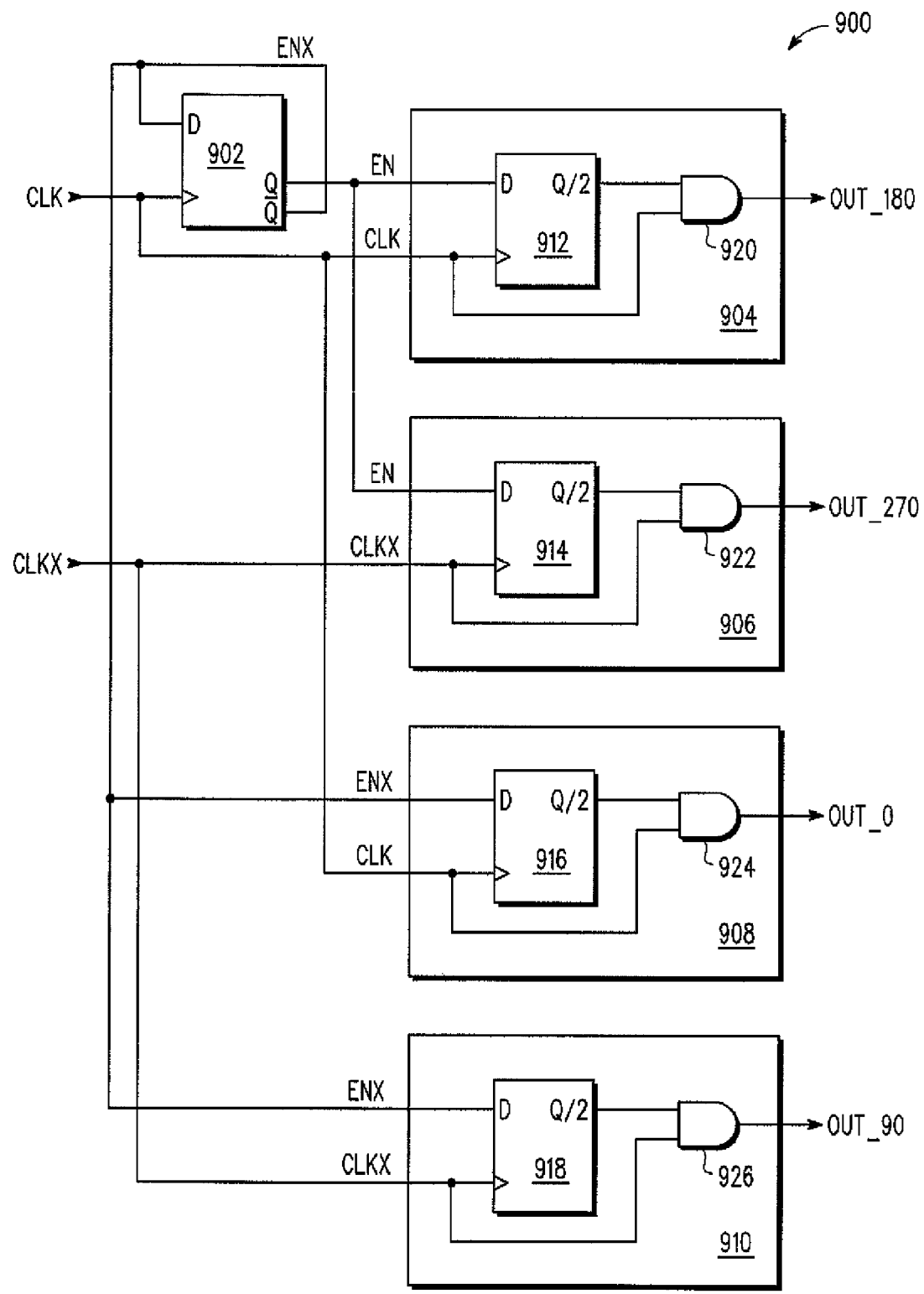
FIG. 9 is a circuit diagram of an alternative embodiment of the pulse generator.

FIG. 9 is a circuit diagram of an alternative embodiment 900 of the pulse generator 116. Using a gated clock configuration, the pulse generator 900 may provide the I pulses OUT_0 and OUT_180 and the Q pulses OUT_90 and OUT_270 to the mixer 114. The I and Q pulses may have a duty cycle of less than 35%. The pulse generator 900 includes a D flip flop 902 and four gated clock circuits 904, 906, 908, and 910. Each of the gated clock circuits 904, 906, 908, and 910 include a divide-by-2 D flip flop 912, 914, 916, and 918 and an AND gate 920, 922, 924, and 926. The D flip flop 902 may provide an enable signal EN and an inverted enable signal ENX to the gated clock circuits 904, 906, 908, and 910, based on the periodic signal CLK. The periodic signal CLK from the local oscillator 118 may be coupled to the edge-sensitive clock input of the D flip flop 902. The inverted enable signal ENX may be fed back and coupled to the D input of the D flip flop 902. Other combinations of passive and/or active elements may be included in the pulse generator 900.

The gated clock circuits 904, 906, 908, and 910 may generate the OUT_180, OUT_270, OUT_0, and OUT_90 pulses, respectively, based on the enable signal EN, the inverted enable signal ENX, the periodic signal CLK, and the inverted periodic signal CLKX. In particular, the outputs of the D flip flops 912, 914, 916, and 918 are ANDed with the periodic signal CLK or inverted periodic signal CLKX to generate the I and Q pulses. The gated clock circuit 904 generates the OUT_180 pulse based on the enable signal EN and the periodic signal CLK. The gated clock circuit 906 generates the OUT_270 pulse based on the enable signal EN and the inverted periodic signal CLKX. The gated clock circuit 908 generates the OUT_0 pulse based on the inverted enable signal ENX and the periodic signal CLK. The gated clock circuit 910 generates the OUT_90 pulse based on the inverted enable signal ENX and the inverted periodic signal CLKX.

Figure 10:
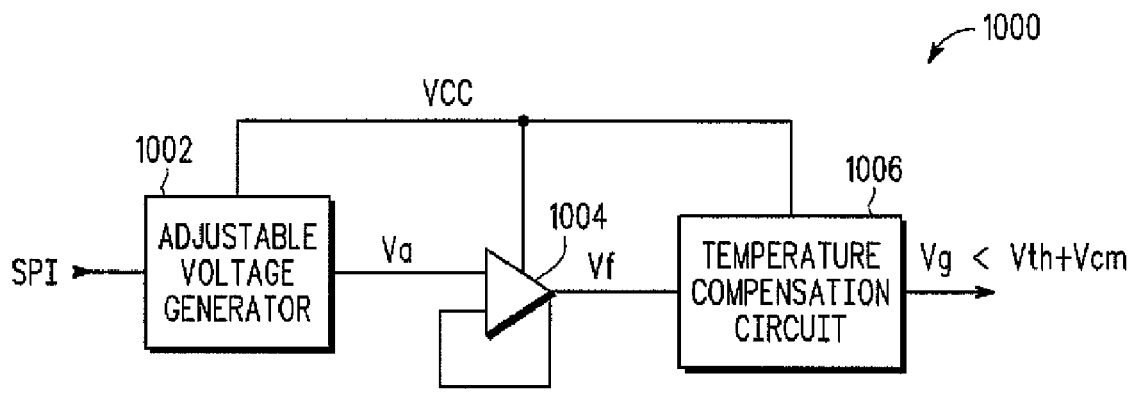
FIG. 10 is a diagram of an embodiment of a crossover correction circuit.

FIG. 10 is a diagram of an embodiment of a crossover correction circuit 1000. The crossover correction circuit 1000 may be positioned in parallel with the pulse generator 116 to provide amplitude crossover threshold adjustment of the I and Q pulses OUT_0, OUT_90, OUT_180, and OUT_270 provided to the mixer 114. In particular, the crossover correction circuit 1000 may generate a gate voltage bias Vg that is connected to the gates on the transistors 402, 404, 406, 408, 410, 412, 414, and 416. The gate voltage bias Vg may adjust the gate voltage on each of the transistors to change the amplitude crossover threshold. The amplitude crossover threshold includes the crossing point of the I and Q pulses when one pulse is rising and the other is failing. In particular, the crossover correction circuit may adjust the amplitude crossover threshold to reduce the amount of time when the I and Q pulses are simultaneously active. Because the I and Q pulses may control switches in the mixer 114, adjusting the amplitude crossover threshold of the I and Q pulses may result in the switches not being turned on at the same time.

A digital control signal SPI may be provided to an adjustable voltage generator 1002. The control signal SPI may be provided by a controller, such as through a serial to parallel interface, to variably adjust the crossover threshold of the I and Q pulses. The voltage Va generated by the generator 1002 may be coupled to a differential amplifier 1004. The differential amplifier 1004 may be configured to compare the desired crossover threshold set by the voltage Va with the voltage Vf output from the differential amplifier 1004. The differential amplifier 1004 may adjust the voltage Vf so that it tracks the voltage Va. An optional temperature compensation circuit 1006 may receive and adjust the voltage Vf and output a gate voltage bias Vg. The temperature compensation circuit 1006 may compensate for variations in the threshold voltage. The gate voltage bias Vg biases the crossover threshold of the I and Q pulses, and may compensate for temperature, process, or other variations. The gate voltage bias Vg may be adjusted so that it is less than the threshold voltage Vth added to the voltage Vcm, where Vcm is the common mode voltage at the input of the direct coupled filter 120. If the crossover correction circuit 1000 does not include the temperature compensation circuit 1006, then the crossover threshold may be biased by the voltage Vf. The crossover threshold of the I and Q pulses may be adjusted with other techniques, including level shifting the I and Q pulses with a voltage divider, sizing of the transistors comprising the mixer 114, or other techniques.

Figure 11:
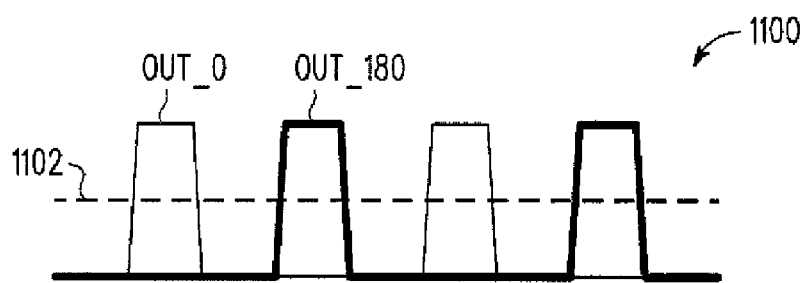
FIG. 11 is a plot of complementary pulse shaped signals with a crossover threshold for the in-phase mixer.

FIG. 11 is a plot 1100 of I pulses OUT_0 and OUT_180 with a crossover threshold 1102. In FIG. 11, the I pulses OUT_0 and OUT_180 have an approximately 25% duty cycle and non-ideal rise and fall times. The I pulses do not substantially overlap when, for example, the OUT_0 pulse is falling and the OUT_180 pulse is rising, or vice versa. Accordingly, the transistors 402, 404, 406, and 408 in the mixer 114 are not turned on simultaneously. In particular, the transistors 402 and 408 are turned on when the OUT_0 pulse is high, and are turned off when the OUT_0 pulse goes low and before the OUT_180 pulse begins rising. Similarly, the transistors 404 and 406 are turned off when the OUT_180 pulse is low, and are turned on when the OUT_180 pulse goes high and after the OUT_0 pulse has fallen. The crossover threshold 1102 does not need to be adjusted in this case. A similar situation may exist with the Q pulses OUT_90 and OUT_270 that are 180 degrees out of phase from one another.

Figure 12:
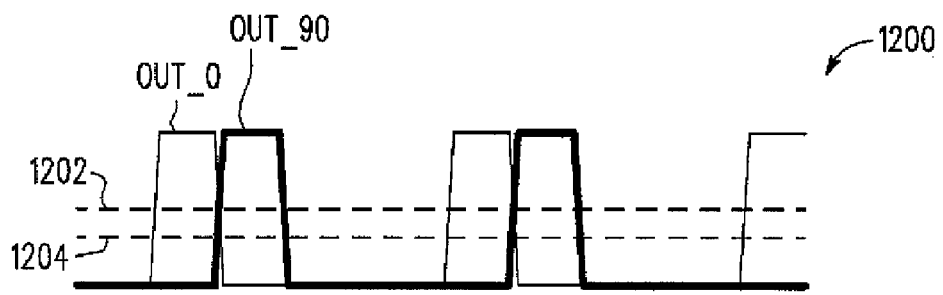
FIG. 12 is a plot of pulse shaped signals with an adjusted crossover threshold for the in-phase and quadrature mixers.

FIG. 12 is a plot 1200 of the I pulse OUT_0 and the Q pulse OUT_90 with an adjusted crossover threshold 1204. In FIG. 12, the I pulse OUT_0 and Q pulse OUT_90 have an approximately 25% duty cycle and non-ideal rise and fall times. The OUT_0 and OUT_90 pulses overlap when, for example, the OUT_0 pulse is falling and the OUT_90 pulse is rising. If the rise and falls times are ideal (e.g., vertical or infinite slope) with less than a 25% duty cycle, then the transistors in the mixer 114 controlled by the OUT_0 and OUT_90 pulses are not turned on at the same time. However, due to the non-ideality of the rise and fall times, the transistors in the mixer 114 controlled by the OUT_0 and OUT_90 pulses may be turned on at the same time. For example, at the non-adjusted crossover threshold 1202, the OUT_0 and OUT_90 pulses are at approximately 50% of the supply voltage. In this case, the transistors 402 and 408 in the mixer 114 may be partially on due to the OUT_0 pulse, and the transistors 410 and 416 in the mixer 114 may be partially on due to the OUT_90 pulse. Increased current drain and unsatisfactory performance of the mixer 114 and the receiver 100 may result.

The amplitude crossover threshold may be adjusted to the adjusted crossover threshold 1204 by a crossover correction circuit, such as the circuit 1000. The adjusted crossover threshold 1204 is biased down from the non-adjusted amplitude crossover threshold 1202 such that there is a different crossover point for the OUT_0 and OUT_90 pulses. At the adjusted crossover threshold 1204, the overlap between the OUT_0 and OUT_90 pulses is substantially reduced. In this case, the transistors 402 and 408 controlled by the OUT_0 pulse and the transistors 410 and 416 controlled by the OUT_90 pulse are not substantially turned on at the same time. The crossover threshold may also be adjusted for the pulses OUT_90 and OUT_180, OUT_180 and OUT_270, and OUT_0 and OUT_270 that are 90 degrees out of phase from one another.

Figure 13:
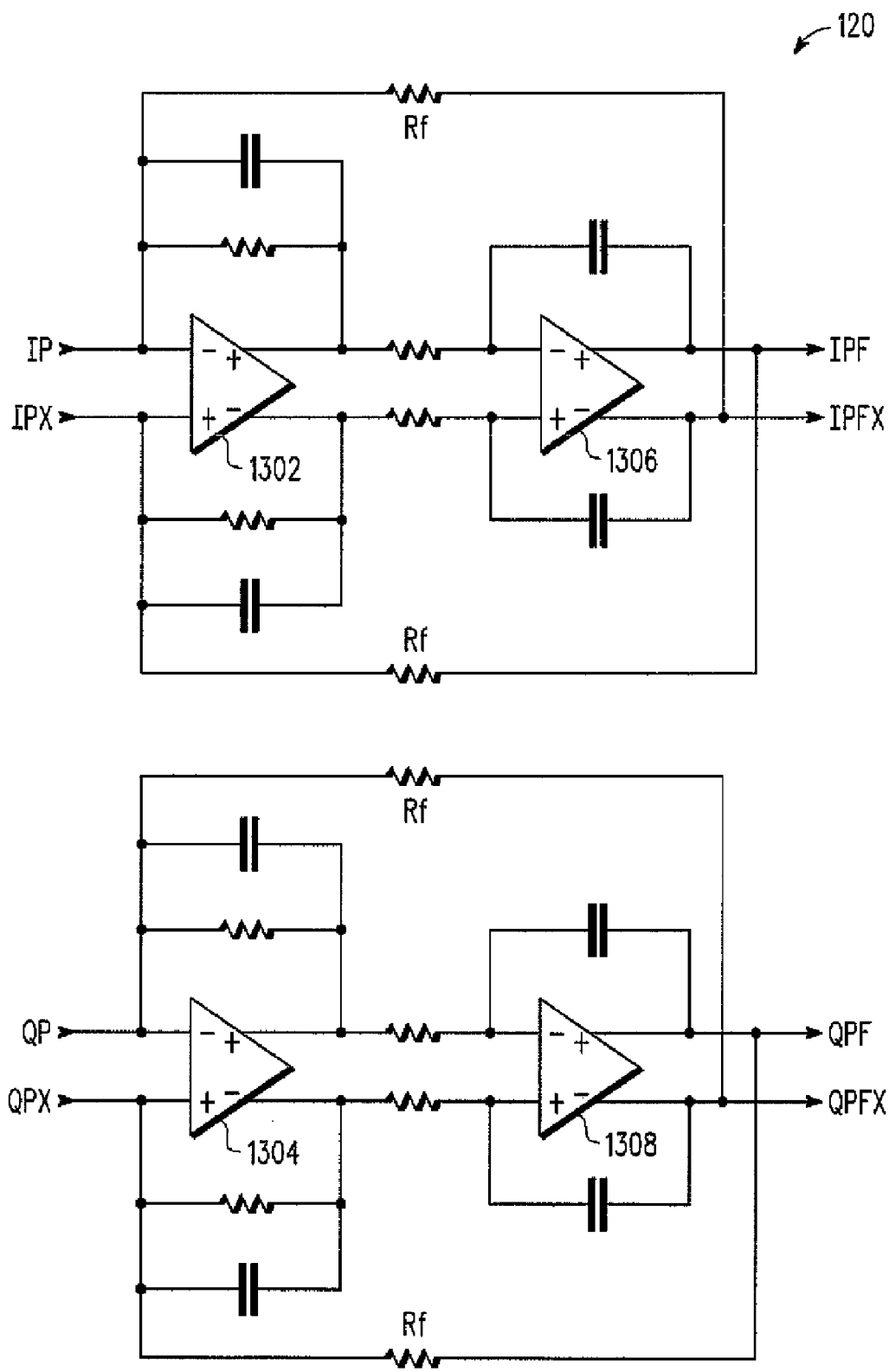
FIG. 13 is a circuit diagram of an embodiment of a direct coupled complex filter in the embodiment of the radio frequency receiver of FIG. 1.

FIG. 13 is a circuit diagram of an embodiment of a direct coupled complex filter 120 in the embodiment of the radio frequency receiver 100. The filter 120 may perform second order filtering of the differential currents comprising the intermediate frequency signals IP, IPX, QP, and QPX. The mixer 114 may provide the intermediate frequency signals to the filter 120. Two fully differential operational amplifiers 1302 and 1304 with R and C in feedback form a second order complex biquadratic transfer function in the filter 120. The filter 120 is a transimpedance filter where the input is a current which is filtered and transferred into voltage at the output. The filter 120 includes voltage mode operational amplifiers 1302, 1304, 1306, and 1308. The amplifiers 1302 and 1304 receive the IP and IPX, and QP and QPX signals, respectively, as currents from the mixer 114. The amplifiers 1302, 1304, 1306, and 1308 may produce differential filtered analog signals IPF, IPFX, QPF, and QPFX. Using the filter 120 to filter the intermediate frequency signals IP, IPX, QP, and QPX may result in a relaxed linearity requirement in downstream processing stages, and reduction in noise, die size, and current drain. The differential filtered analog signals IPF, IPFX, QPF, and QPFX may be converted to digital signals downstream, and digital signal processed to retrieve the information contained in the received RF signal.

The topology of the direct coupled complex filter 120 may be similar in appearance to a Tow Thomas Biquad filter, however, the filter 120 includes no resistors at the input that add noise and significantly degrade linearity (e.g., voltage mode operation). Since the filter 120 does not have a resistor at the input and instead operates in current mode, the gain is determined by the transconductance of the circuit shown in FIG. 2 and the feedback resistors Rf shown in FIG. 13. Other combinations of passive and/or active elements may be included in the filter 120. Those skilled in the art can realize that the direct coupled filter 120 may be realized with a multitude of filter and operational amplifier topologies, and combinations thereof, and is not limited to that shown in FIG. 13, for example Av, AI, or current conveyor, and can be expanded to include any order of filter.

Figure 14:
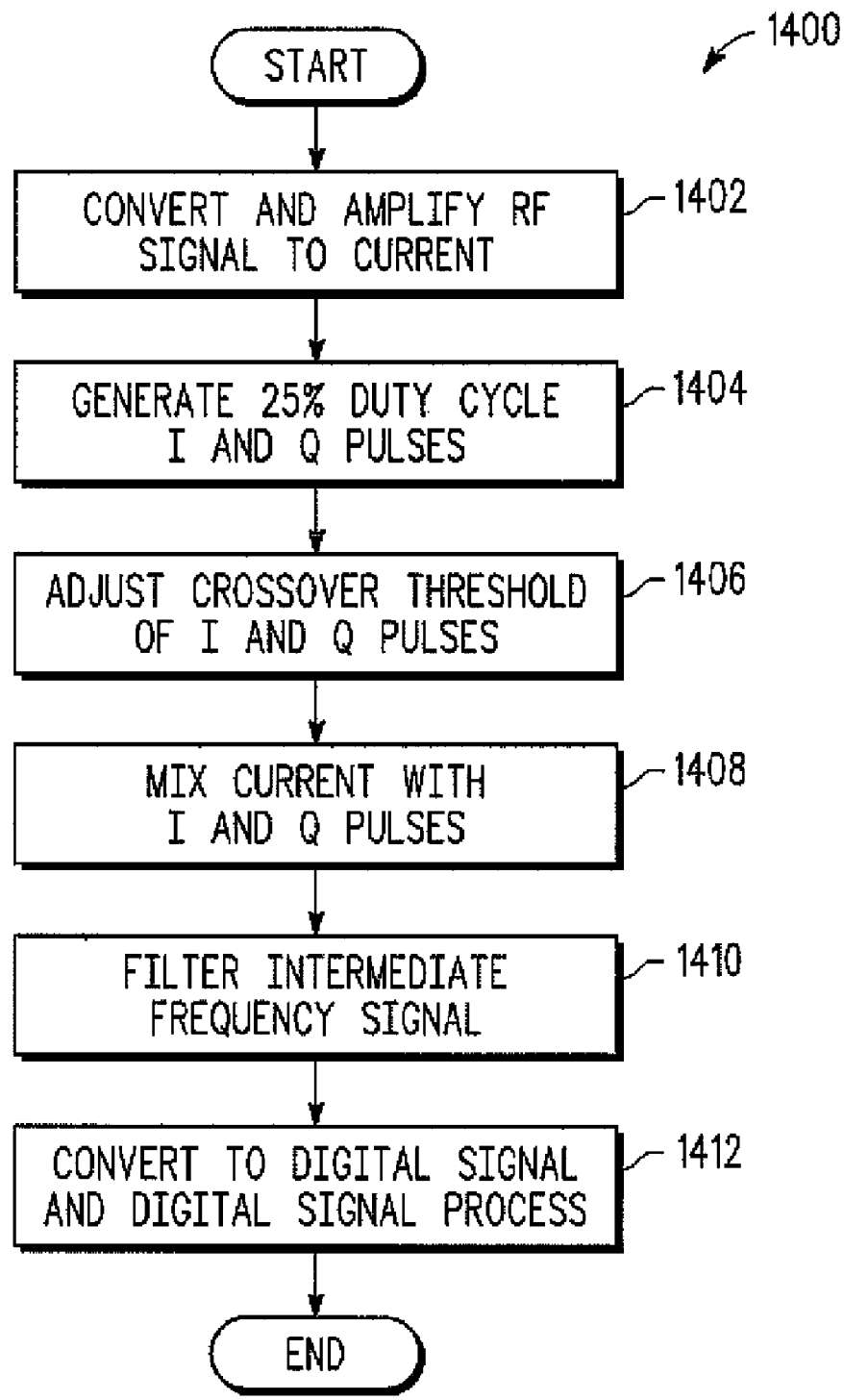
FIG. 14 is a flowchart of an embodiment of a method for receiving a radio frequency signal.

FIG. 14 is a flowchart of an embodiment of a method 1400 for receiving a radio frequency signal. The method may be implemented using the radio frequency receiver 100 and the embodiments of the components described above, or with alternative receiver configurations. Additional, different, or fewer steps may be provided than shown in FIG. 14.

At Step 1402, a voltage of a received radio frequency signal may be converted to a current and amplified. The RF signal may be converted by a low noise amplifier that converts a voltage to a current. The amplifier may include step control or binary weighting control to adjust the amplification. At Step 1404, pulses with a duty cycle of less than 35% may be generated based on a periodic signal. The pulses may include in-phase (I) and quadrature (Q) pulses, such as pulses that are zero, ninety, one hundred eighty, and two hundred seventy degrees out of phase from a periodic signal. The pulses may be generated with latches, and/or other combinatorial or sequential components. A crossover threshold of the pulses may be adjusted at Step 1406, such that an overlap between a rising and a falling pulse is substantially reduced. The crossover threshold may be adjusted so that switches in a mixer controlled by the pulses are not turned on simultaneously.

At Step 1408, the current generated at Step 1402 may be mixed with the pulses generated at Steps 1404 and 1406 to produce an intermediate frequency signal, which may be a zero intermediate frequency baseband signal. The intermediate frequency signal may include an in-phase signal and a quadrature signal, and may be currents. The mixing at Step 1408 may be performed by a mixer comprising NMOS transistors, for example, to combine the RF signal with I and Q pulses. At Step 1410, the intermediate frequency signal may be filtered to a filtered analog signal. A complex direct coupled filter may perform the filtering at Step 1410. The resulting filtered analog signal may be converted to a digital signal and digitally signal processed to retrieve information in the RF signal at Step 1412. Additional filtering, matching, and other steps may be included in the method 1400 to process the received RF signal to attain desired performance characteristics.

A radio frequency receiver has been disclosed comprising a low noise transconductance amplifier operable to amplify and convert a received voltage of a radio frequency signal to a first current; a pulse generator operable to generate pulses from a periodic signal, the pulses having a duty cycle of 35% or less; a double balanced mixer operable to combine the first current with the pulses to produce a second current, the second current comprising an intermediate frequency signal; and a direct coupled complex filter operable to filter the second current to a filtered analog signal. The radio frequency receiver may further comprise a crossover correction circuit operable to control a crossover threshold of the pulses, where the pulses comprise in-phase pulses and quadrature pulses; the crossover threshold comprises a crossing point of an amplitude of the in-phase pulses and the quadrature pulses, the crossing point selected to reduce the amount of time the in-phase pulses and quadrature pulses are simultaneously active; and the intermediate frequency signal comprises an in-phase signal and a quadrature signal. The double balanced mixer may comprise CMOS transistors where the crossover correction circuit is operable to bias a gate voltage of the CMOS transistors to select the crossing point. The duty cycle of the pulses may be between 20% and 35%.

The pulses may comprise in-phase pulses and quadrature pulses where the in-phase pulses comprise a first pulse zero degrees out of phase from the periodic signal and a second pulse one hundred eighty degrees out of phase from the periodic signal, and the quadrature pulses comprise a third pulse ninety degrees out of phase from the periodic signal and a fourth pulse two hundred seventy degrees out of phase from the periodic signal. The pulse generator may comprise a first latch operable to generate the quadrature pulses and a first latch output based on the periodic signal and a second latch output, and a second latch operable to generate the in-phase pulses and the second latch output based on the periodic signal and the first latch output. The first latch and the second latch may comprise a gated clock circuit.

The radio frequency receiver may further comprise an active bias generation circuit configured to bias the amplifier such that low frequency bias noise in the radio frequency signal is inhibited in the presence of large blocking signals. The active bias generation circuit comprises a reference current source coupled to a supply voltage and a node; a first NMOS transistor with a source coupled to ground, a drain coupled to the node, and a gate coupled to the received voltage; and a second NMOS transistor with a source coupled to the received voltage, a drain coupled to the supply voltage, and a gate coupled to the node. The low noise transconductance amplifier is further operable to amplify and convert the received voltage of the radio frequency signal to the first current using step weighting and binary weighting. The radio frequency receiver may further comprise a gain matching circuit operable to step up an impedance of the received voltage to match an input impedance of the low noise transconductance amplifier.

A method of receiving a radio frequency signal has been disclosed comprising converting and amplifying a voltage of the radio frequency signal to a first current; generating pulses from a periodic signal, the pulses having a duty cycle of 35% or less; mixing the first current with the pulses to produce a second current, the second current comprising an intermediate frequency signal; and filtering the second current to a filtered analog signal. The method may further comprise correcting a crossover threshold of the pulses, where the pulses comprise in-phase pulses and quadrature pulses; correcting the crossover threshold comprises selecting a crossing point of the in-phase pulses and the quadrature pulses to reduce the amount of time the in-phase pulses and quadrature pulses are simultaneously active; and the intermediate frequency signal comprises an in-phase signal and a quadrature signal. Correcting the crossover threshold may comprise biasing a gate voltage of a CMOS transistor to select the crossing point. The duty cycle of the pulses may be between 20% and 35%.

The pulses may comprise in-phase pulses and quadrature pulses, where the in-phase pulses comprise a first pulse zero degrees out of phase from the periodic signal and a second pulse one hundred eighty degrees out of phase from the periodic signal; and the quadrature pulses comprise a third pulse ninety degrees out of phase from the periodic signal and a fourth pulse two hundred seventy degrees out of phase from the periodic signal. Generating pulses in the method may comprise generating the quadrature pulses and a first latch output based on the periodic signal and a second latch output, and generating the in-phase pulses and the second latch output based on the periodic signal and the first latch output. The method may further comprise step weighting and binary weighting the amplification of the voltage of the radio frequency signal to the first current. The method may also comprise inhibiting low frequency bias noise in the radio frequency signal in the presence of large blocking signals.

An analog front end of a radio frequency receiver has been disclosed, comprising a low noise amplifier operable to amplify and convert a received voltage of a radio frequency signal to a first current, the low noise amplifier configured to step weight and binary weight the amplification; a pulse generator operable to generate in-phase and quadrature pulses based on a periodic signal, the in-phase and quadrature pulses having an approximately 25% duty cycle and comprising a first pulse zero degrees out of phase from the periodic signal, a second pulse one hundred eighty degrees out of phase from the periodic signal, a third pulse ninety degrees out of phase from the periodic signal, and a fourth pulse two hundred seventy degrees out of phase from the periodic signal; and a mixer operable to combine the first current with the in-phase and quadrature pulses to produce a second current, the second current comprising an intermediate frequency signal. The analog front end may further comprise a crossover correction circuit operable to control an amplitude crossover threshold of the in-phase and quadrature pulses, such that the in-phase and quadrature pulses are not active simultaneously; and a direct coupled complex filter operable to filter the intermediate frequency signal to a filtered analog signal.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

As used herein, the phrases "coupled with," "coupled between," or like phrases, are defined to mean directly connected to or indirectly connected through one or more intermediate components. Unless stated otherwise, terms such as "first" and "second" are used to arbitrarily distinguish between the elements such terms describe. Thus, these terms are not necessarily intended to indicate temporal or other prioritization of such elements.

What is claimed is:

1. A radio frequency receiver, comprising:
   a low noise transconductance amplifier operable to amplify and convert a received voltage of a radio frequency signal to a first current;
   a pulse generator operable to generate pulses from a periodic signal, the pulses having a duty cycle of 35% or less;
   a crossover correction circuit to reduce overlap of the pulses;
   a double balanced mixer operable to combine the first current with the pulses to produce a second current, the second current comprising an intermediate frequency signal; and
   a direct coupled complex filter operable to filter the second current to a filtered analog signal;
   where the crossover correction circuit is operable to control a crossover threshold of the pulses and where:
   the pulses comprise in-phase pulses and quadrature pulses;
   the crossover threshold comprises a crossing point of an amplitude of the in-phase pulses and the quadrature pulses, the crossing point selected to reduce the amount of time the in-phase pulses and quadrature pulses are simultaneously active; and
   the intermediate frequency signal comprises an in-phase signal and a quadrature signal.

2. The radio frequency receiver of claim 1, where the double balanced mixer comprises CMOS transistors and the crossover correction circuit is operable to bias a gate voltage of the CMOS transistors to select the crossing point.

3. The radio frequency receiver of claim 1, where the duty cycle is between 20% and 35%.

4. The radio frequency receiver of claim 1, where:
   the pulses comprise in-phase pulses and quadrature pulses;
   the in-phase pulses comprise a first pulse zero degrees out of phase from the periodic signal and a second pulse one hundred eighty degrees out of phase from the periodic signal; and
   the quadrature pulses comprise a third pulse ninety degrees out of phase from the periodic signal and a fourth pulse two hundred seventy degrees out of phase from the periodic signal.

5. The radio frequency receiver of claim 1, further comprising an active bias generation circuit configured to bias the amplifier such that low frequency bias noise in the radio frequency signal is inhibited in the presence of large blocking signals.

6. The radio frequency receiver of claim 5, where the active bias generation circuit comprises a reference current source coupled to a supply voltage and a node; a first NMOS transistor with a source coupled to ground, a drain coupled to the node, and a gate coupled to the received voltage; and a second NMOS transistor with a source coupled to the received voltage, a drain coupled to the supply voltage, and a gate coupled to the node.

7. The radio frequency receiver of claim 1, where the low noise transconductance amplifier is further operable to amplify and convert the received voltage of the radio frequency signal to the first current using step weighting and binary weighting.

8. The radio frequency receiver of claim 1, further comprising a gain matching circuit operable to step up an impedance of the received voltage to match an input impedance of the low noise transconductance amplifier.

9. A radio frequency receiver, comprising:
   a low noise transconductance amplifier operable to amplify and convert a received voltage of a radio frequency signal to a first current;
   a pulse generator operable to generate pulses from a periodic signal, the pulses having a duty cycle of 35% or less;
   a double balanced mixer operable to combine the first current with the pulses to produce a second current, the second current comprising an intermediate frequency signal; and
   a direct coupled complex filter operable to filter the second current to a filtered analog signal,
   where the pulses comprise in-phase pulses and quadrature pulses, and the pulse generator comprises a first latch operable to generate the quadrature pulses and a first latch output based on the periodic signal and a second latch output, and a second latch operable to generate the in-phase pulses and the second latch output based on the periodic signal and the first latch output.

10. The radio frequency receiver of claim 9, where the first latch and the second latch comprise a gated clock circuit.

11. A method of receiving a radio frequency signal, comprising:
   converting and amplifying a voltage of the radio frequency signal to a first current;
   generating pulses from a periodic signal, the pulses having a duty cycle of 35% or less;
   reducing overlap of the pulses;
   mixing the first current with the pulses to produce a second current, the second current comprising an intermediate frequency signal; and
   filtering the second current to a filtered analog signal;
   where reducing the overlap of the pulses comprises correcting a crossover threshold of the pulses, and where:
   the pulses comprise in-phase pulses and quadrature pulses;
   correcting the crossover threshold comprises selecting a crossing point of the in-phase pulses and the quadrature pulses to reduce the amount of time the in-phase pulses and quadrature pulses are simultaneously active; and
   the intermediate frequency signal comprises an in-phase signal and a quadrature signal.

12. The method of claim 11, where correcting the crossover threshold comprises biasing a gate voltage of a CMOS transistor to select the crossing point.

13. The method of claim 11, where the duty cycle is between 20% and 35%.

14. The method of claim 11, where:
   the pulses comprise in-phase pulses and quadrature pulses;
   the in-phase pulses comprise a first pulse zero degrees out of phase from the periodic signal and a second pulse one hundred eighty degrees out of phase from the periodic signal; and the quadrature pulses comprise a third pulse ninety degrees out of phase from the periodic signal and a fourth pulse two hundred seventy degrees out of phase from the periodic signal.

15. The method of claim 11, further comprising step weighting and binary weighting the amplification of the voltage of the radio frequency signal to the first current.

16. The method of claim 11, further comprising inhibiting low frequency bias noise in the radio frequency signal in the presence of large blocking signals.

17. A method of receiving a radio frequency signal, comprising:
   converting and amplifying a voltage of the radio frequency signal to a first current;
   generating pulses from a periodic signal, the pulses having a duty cycle of 35% or less;
   mixing the first current with the pulses to produce a second current, the second current comprising an intermediate frequency signal; and
   filtering the second current to a filtered analog signal,
   where the pulses comprise in-phase pulses and quadrature pulses, and generating pulses comprises generating the quadrature pulses and a first latch output based on the periodic signal and a second latch output, and generating the in-phase pulses and the second latch output based on the periodic signal and the first latch output.

18. An analog front end of a radio frequency receiver, comprising:
   a low noise amplifier operable to amplify and convert a received voltage of a radio frequency signal to a first current, the low noise amplifier configured to step weight and binary weight the amplification;
   a pulse generator operable to generate in-phase and quadrature pulses based on a periodic signal, the in-phase and quadrature pulses having an approximately 25% duty cycle and comprising a first pulse zero degrees out of phase from the periodic signal, a second pulse one hundred eighty degrees out of phase from the periodic signal, a third pulse ninety degrees out of phase from the periodic signal, and a fourth pulse two hundred seventy degrees out of phase from the periodic signal;
   a crossover correction circuit to reduce overlap of the in-phase and quadrature pulses; and
   a mixer operable to combine the first current with the in-phase and quadrature pulses to produce a second current, the second current comprising an intermediate frequency signal;
where:
the crossover correction circuit is operable to control an amplitude crossover threshold of the in-phase and quadrature pulses, such that the in-phase and quadrature pulses are not active simultaneously; and
the analog front end further comprises a direct coupled complex filter operable to filter the intermediate frequency signal to a filtered analog signal.

19. A radio frequency receiver, comprising:
   a low noise transconductance amplifier operable to amplify and convert a received voltage of a radio frequency signal to a first current;
   a pulse generator operable to generate pulses from a periodic signal, the pulses having a duty cycle of 35% or less;
   a crossover correction circuit to reduce overlap of the pulses;
   a double balanced mixer operable to combine the first current with the pulses to produce a second current, the second current comprising an intermediate frequency signal; and
   a direct coupled complex filter operable to filter the second current to a filtered analog signal;
   an active bias generation circuit configured to bias the amplifier such that low frequency bias noise in the radio frequency signal is inhibited in the presence of large blocking signals;
   where the active bias generation circuit comprises a reference current source coupled to a supply voltage and a node; a first NMOS transistor with a source coupled to ground, a drain coupled to the node, and a gate coupled to the received voltage; and a second NMOS transistor with a source coupled to the received voltage, a drain coupled to the supply voltage, and a gate coupled to the node.

* * * * *